(12) United States Patent
Kim et al.

(10) Patent No.: US 12,273,995 B2
(45) Date of Patent: Apr. 8, 2025

(54) POWER MODULE

(71) Applicant: AMOSENSE CO., LTD., Cheonan-si (KR)

(72) Inventors: Taejung Kim, Cheonan-si (KR);
Wonsan Na, Cheonan-si (KR);
Baegeun Lee, Cheonan-si (KR);
Bohyeon Han, Cheonan-si (KR)

(73) Assignee: AMOSENSE CO., LTD., Cheonan-si (KR)

( * ) Notice: Subject to any disclaimer, the term of this patent is extended or adjusted under 35 U.S.C. 154(b) by 228 days.

(21) Appl. No.: 17/927,848

(22) PCT Filed: May 24, 2021

(86) PCT No.: PCT/KR2021/006393
§ 371 (c)(1),
(2) Date: Nov. 25, 2022

(87) PCT Pub. No.: WO2021/241951
PCT Pub. Date: Dec. 2, 2021

(65) Prior Publication Data
US 2023/0217590 A1 Jul. 6, 2023

(30) Foreign Application Priority Data

May 27, 2020 (KR) .................. 10-2020-0063548
Jun. 5, 2020 (KR) .................. 10-2020-0068013
(Continued)

(51) Int. Cl.
*H05K 1/03* (2006.01)
*H05K 1/02* (2006.01)
*H05K 1/11* (2006.01)

(52) U.S. Cl.
CPC .......... *H05K 1/0306* (2013.01); *H05K 1/115* (2013.01); *H05K 1/0209* (2013.01)

(58) Field of Classification Search
CPC ... H01L 25/162; H01L 23/36; H01L 23/3735; H01L 23/48; H01L 24/01; H01L 24/18;
(Continued)

(56) References Cited

U.S. PATENT DOCUMENTS 10,756,057 B2   8/2020  Tanimoto
2020/0113058 A1  4/2020  Xiong et al.

FOREIGN PATENT DOCUMENTS

JP   2013-5542 A      1/2013
JP   2013110303 A  *  6/2013
(Continued)

*Primary Examiner* — Philip C Tucker
*Assistant Examiner* — Brian R Slawski
(74) *Attorney, Agent, or Firm* — Maschoff Brennan

(57) ABSTRACT

The present invention relates to a power module comprising: an upper ceramic substrate (300); a PCB substrate (400) disposed spaced apart from the upper ceramic substrate (300); a plurality of semiconductor chips (G1, G2, G3, G4) spaced apart from each other, arranged in parallel, and mounted on the lower surface of the upper ceramic substrate (300); and a plurality of capacitors (310) mounted on the top surface of the PCB substrate (400) to correspond to locations between the semiconductor chips (G1, G2, G3, G4). The present invention has the advantage of forming a short current path through which the semiconductor chips and the capacitors are connected, thereby increasing a circuit stabilization effect.

5 Claims, 11 Drawing Sheets

(30) Foreign Application Priority Data

Jun. 8, 2020 (KR) .................. 10-2020-0068987
Jun. 12, 2020 (KR) .................. 10-2020-0071392

(58) Field of Classification Search
CPC ........ H01L 24/26; H01L 24/27; H02M 7/003;
H05K 1/0209; H05K 1/0263; H05K
1/0306; H05K 1/115; H05K 1/144; H05K
2201/10166
USPC .......... 713/320; 438/106, 107; 363/123, 125
See application file for complete search history.

(56) References Cited

FOREIGN PATENT DOCUMENTS

| | | |
|---|---|---|
| JP | 5951967 B2 | 7/2016 |
| JP | 6288301 B2 | 3/2018 |
| JP | 6464787 B2 | 2/2019 |

\* cited by examiner

[FIG. 1]
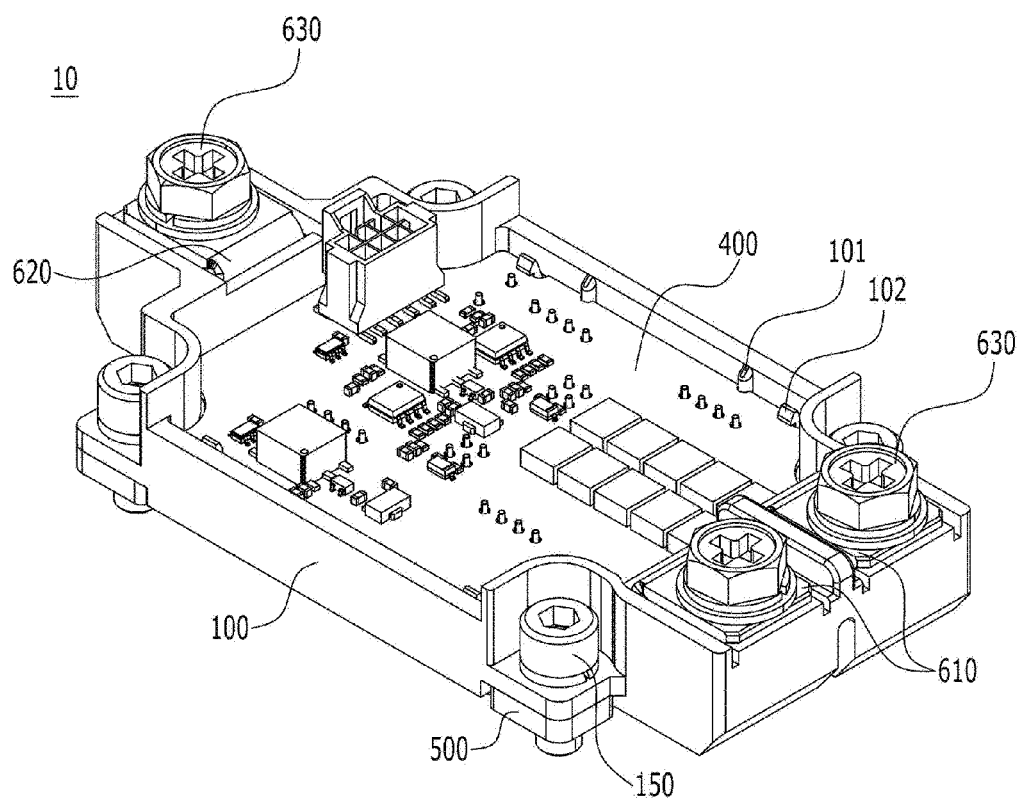

[FIG. 2]
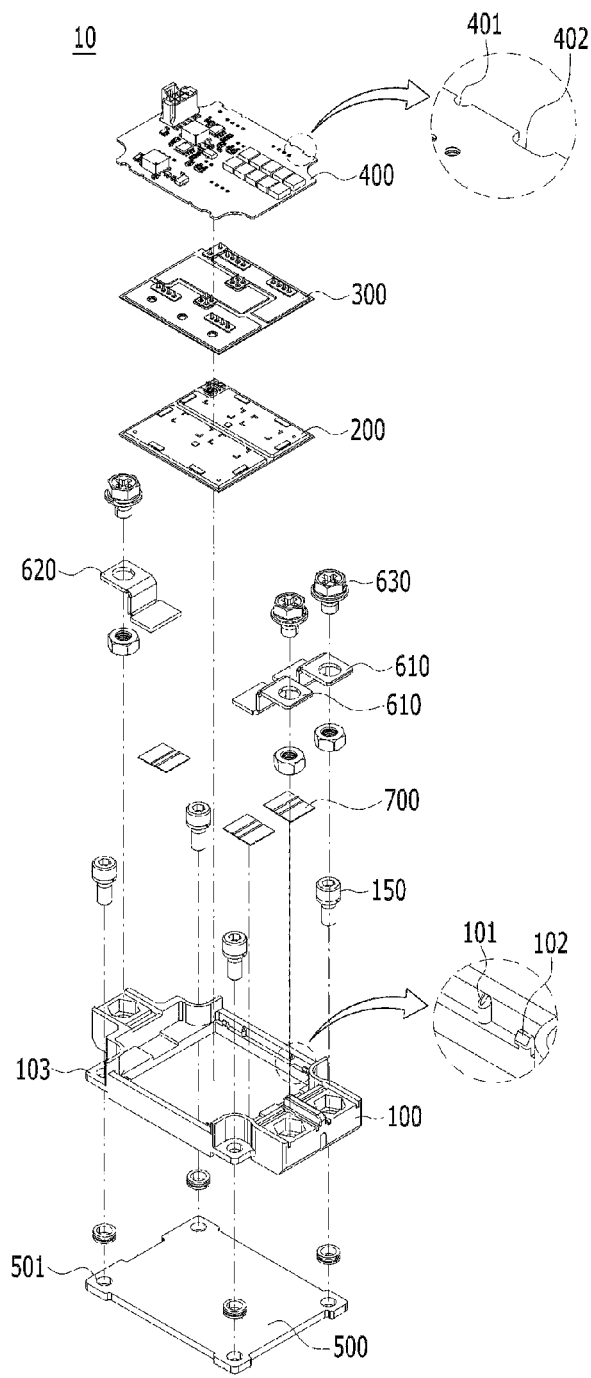

[FIG. 3]
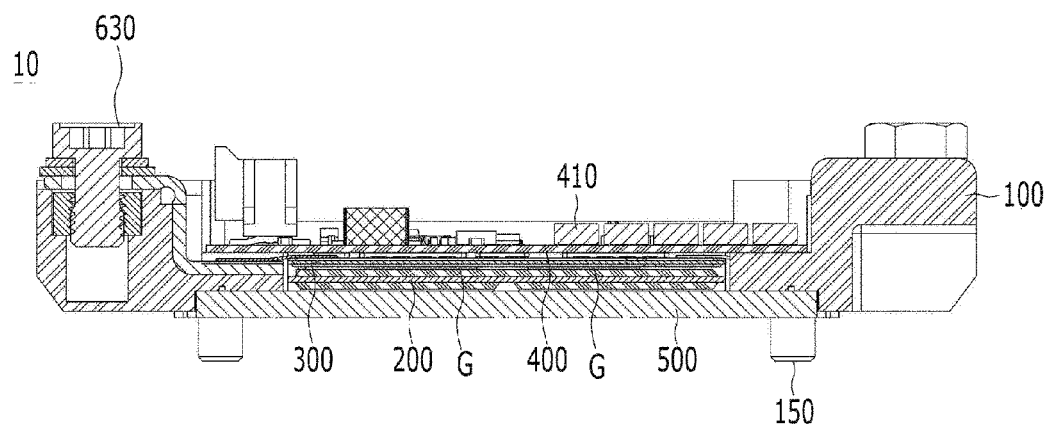
[FIG. 4]
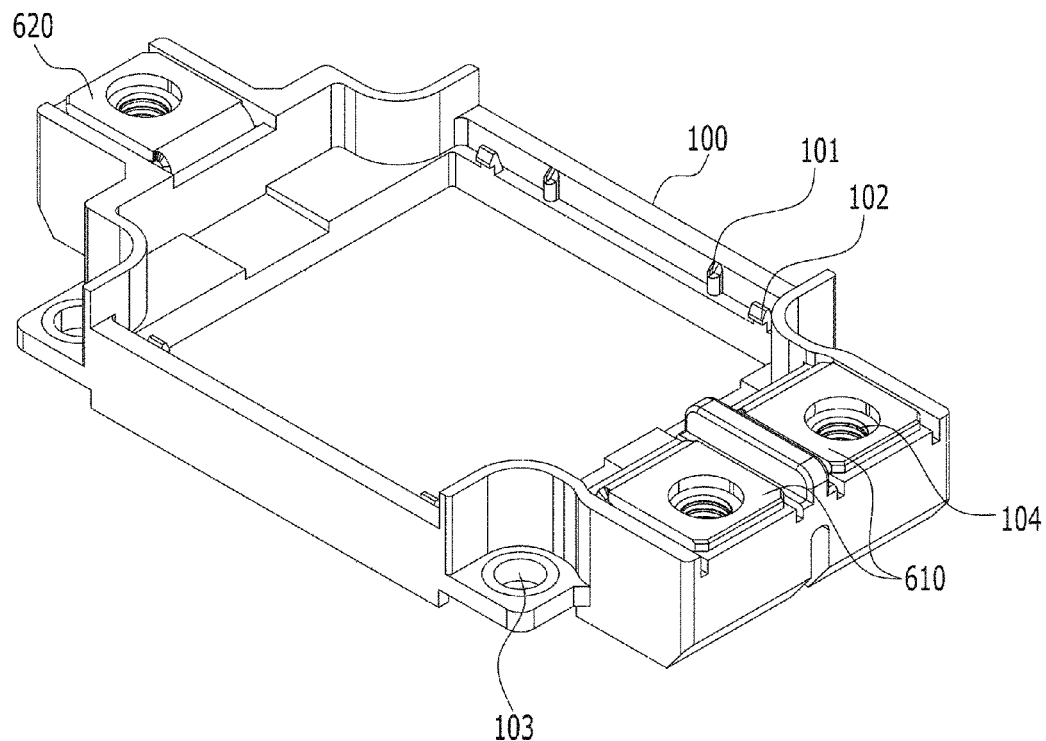

[FIG. 5]
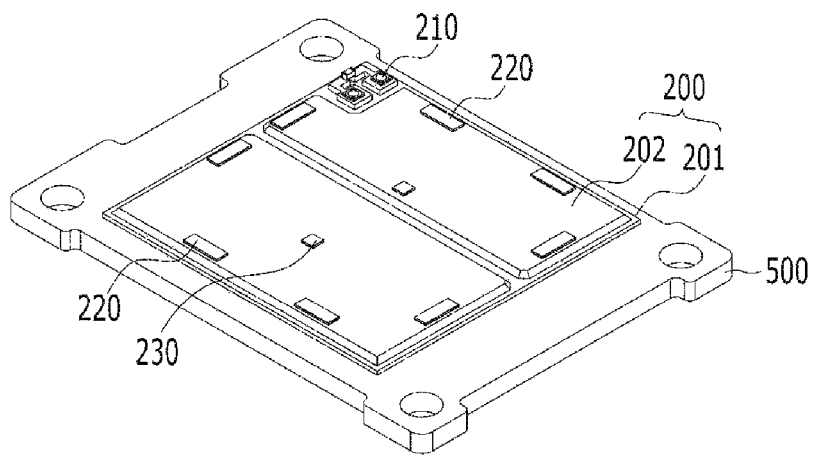
[FIG. 6]
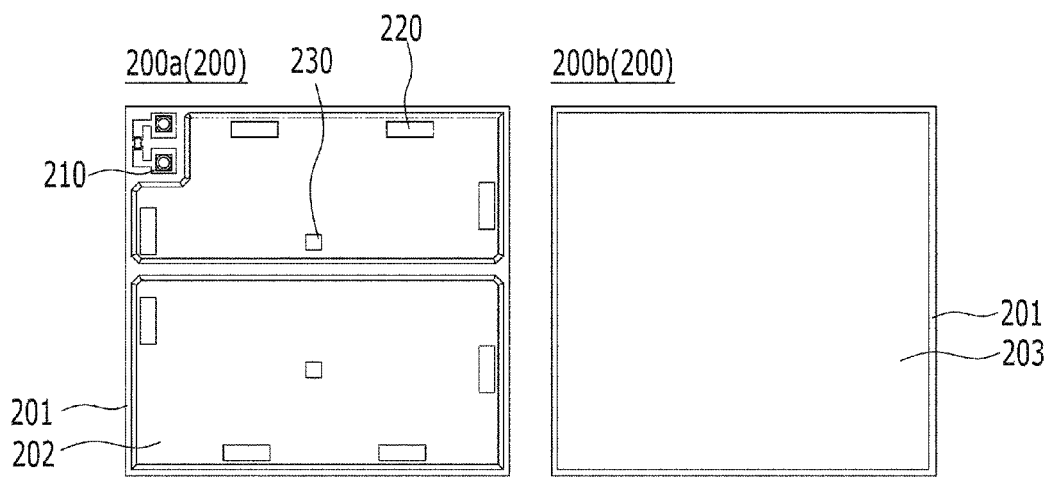

[FIG. 7]
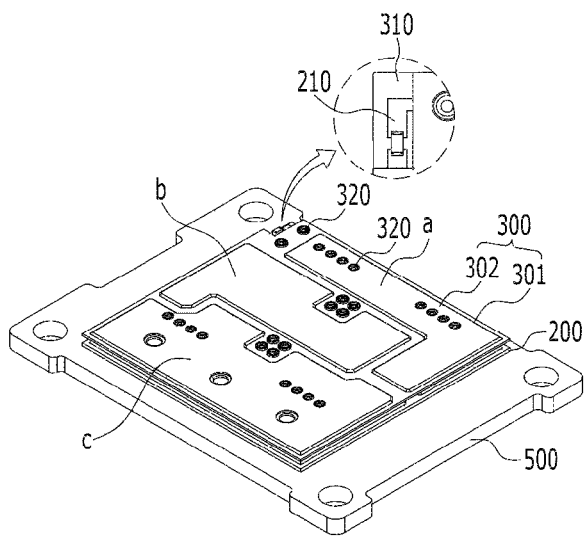
[FIG. 8]
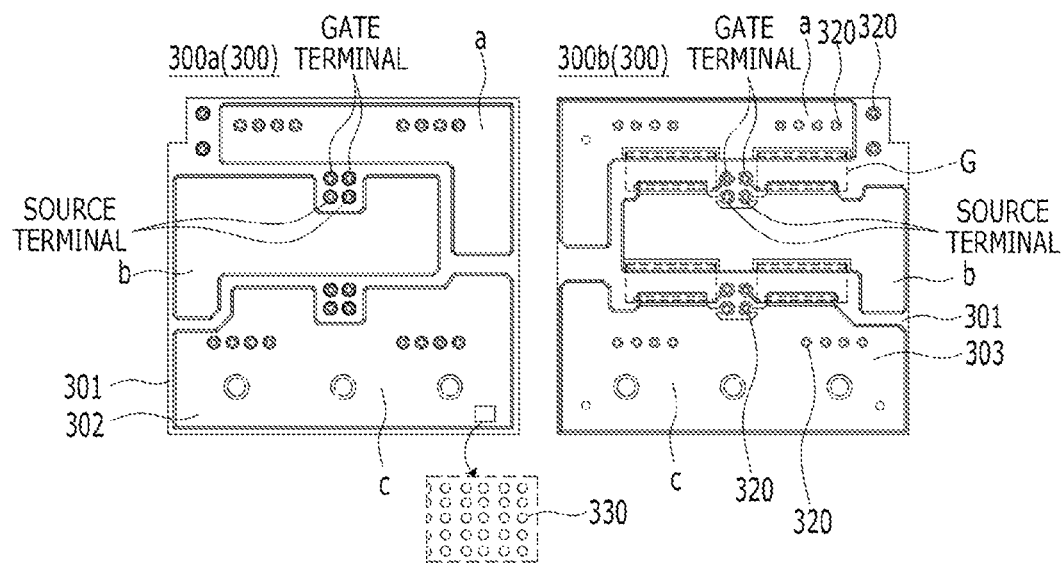

[FIG. 9]
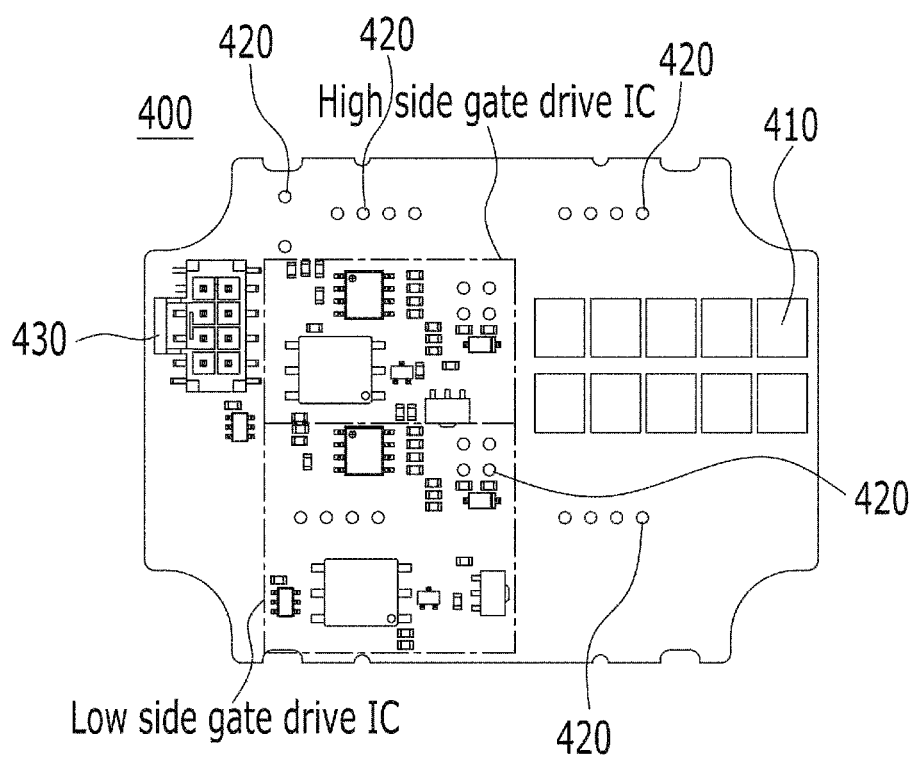

[FIG. 10]
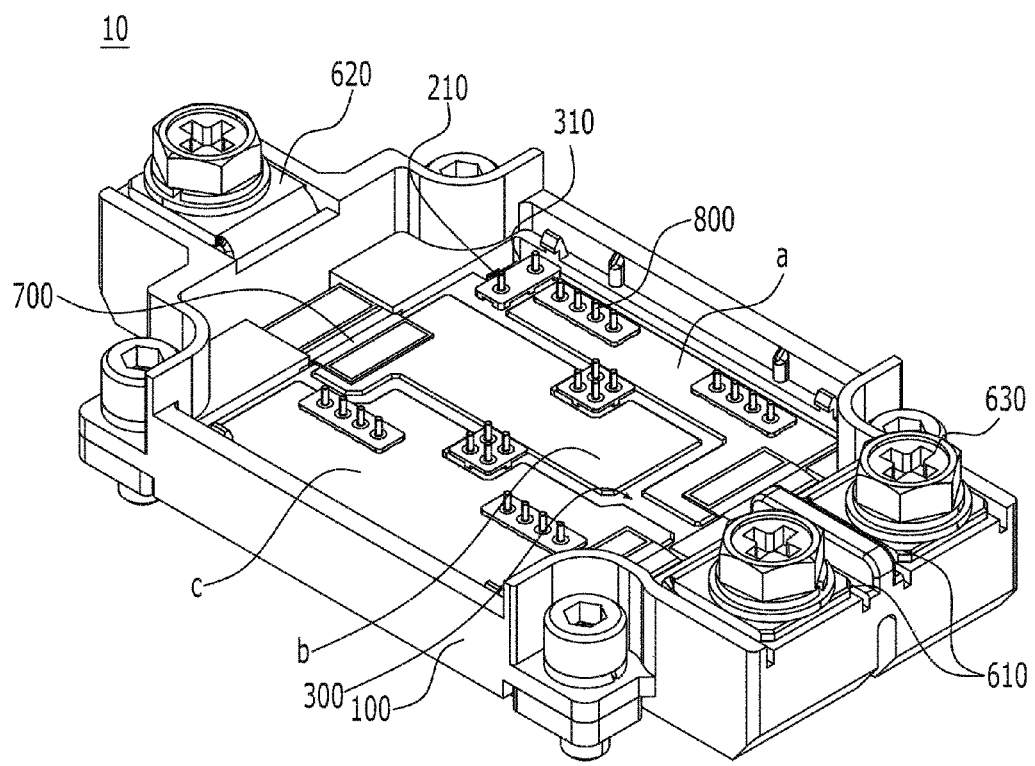

[FIG. 11]
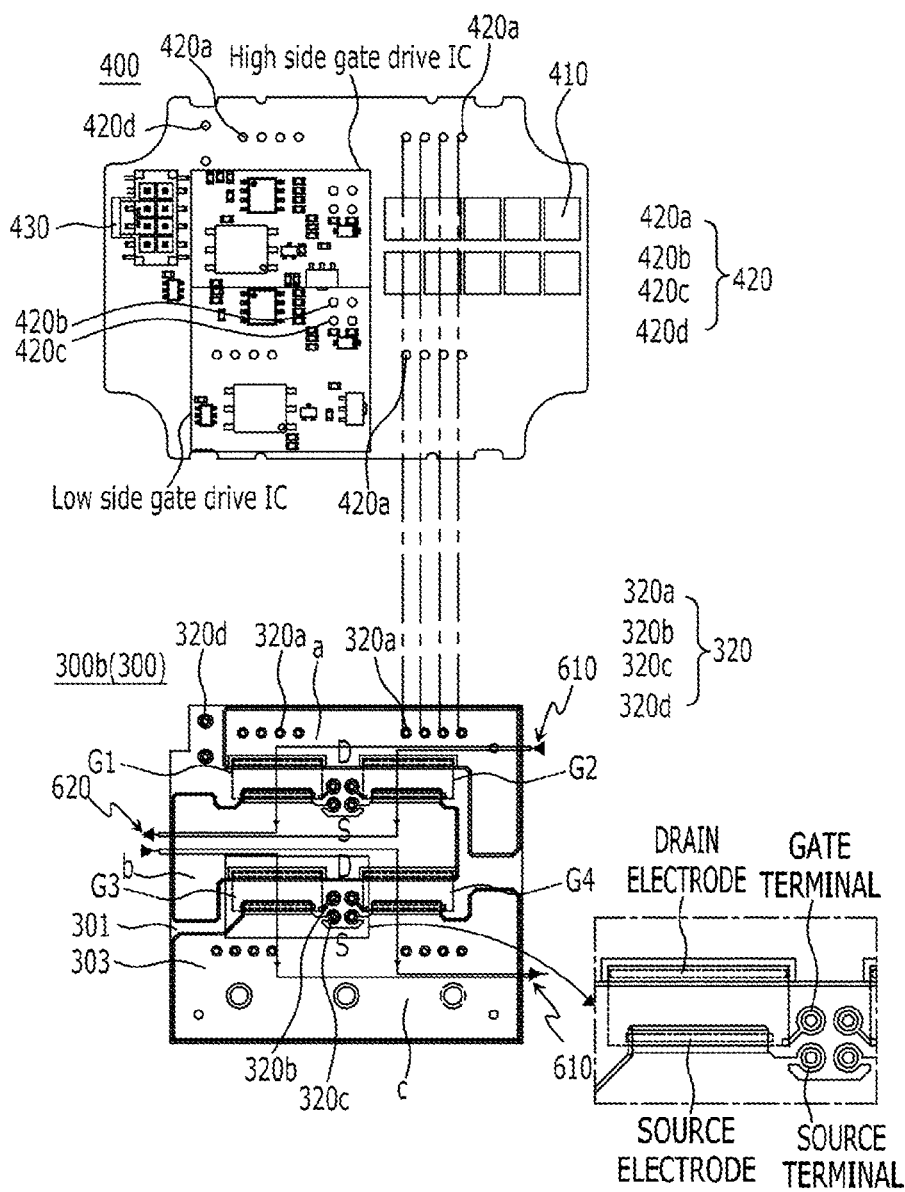

[FIG. 12]
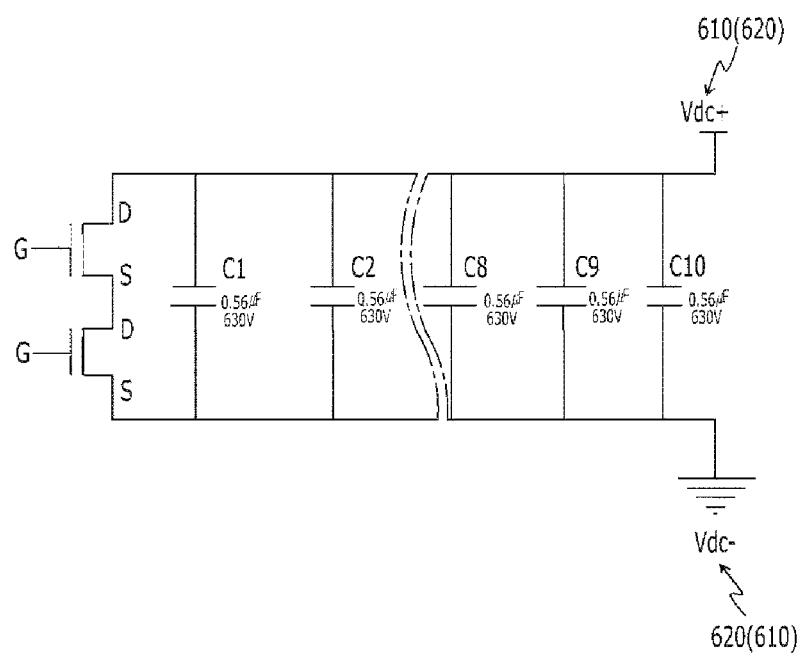

[FIG. 13]
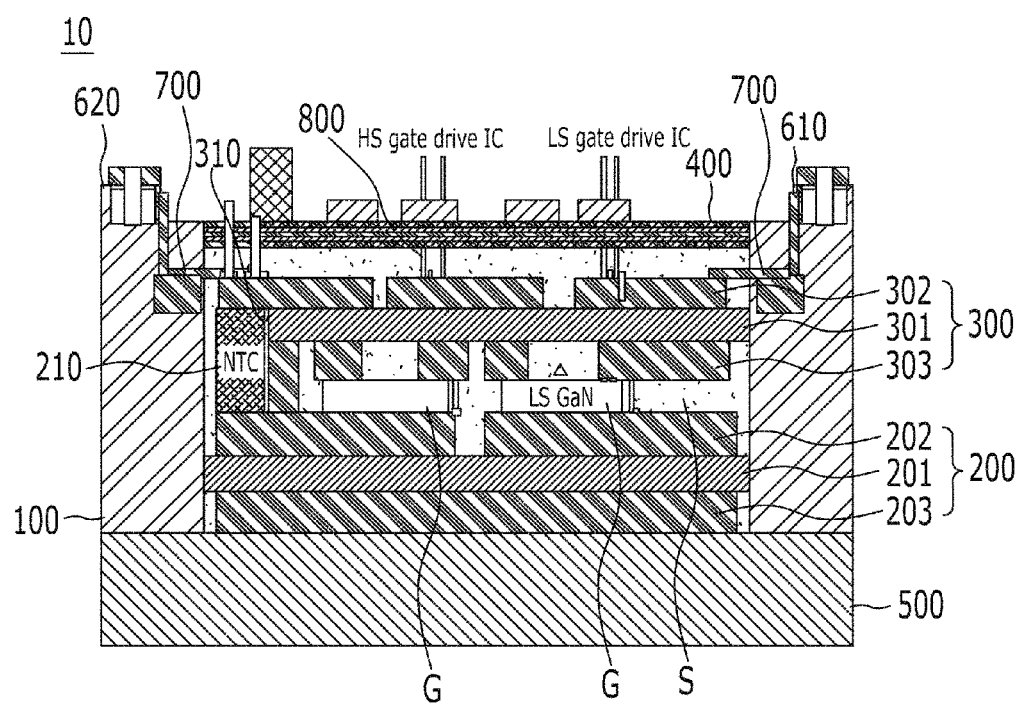

[FIG. 14]
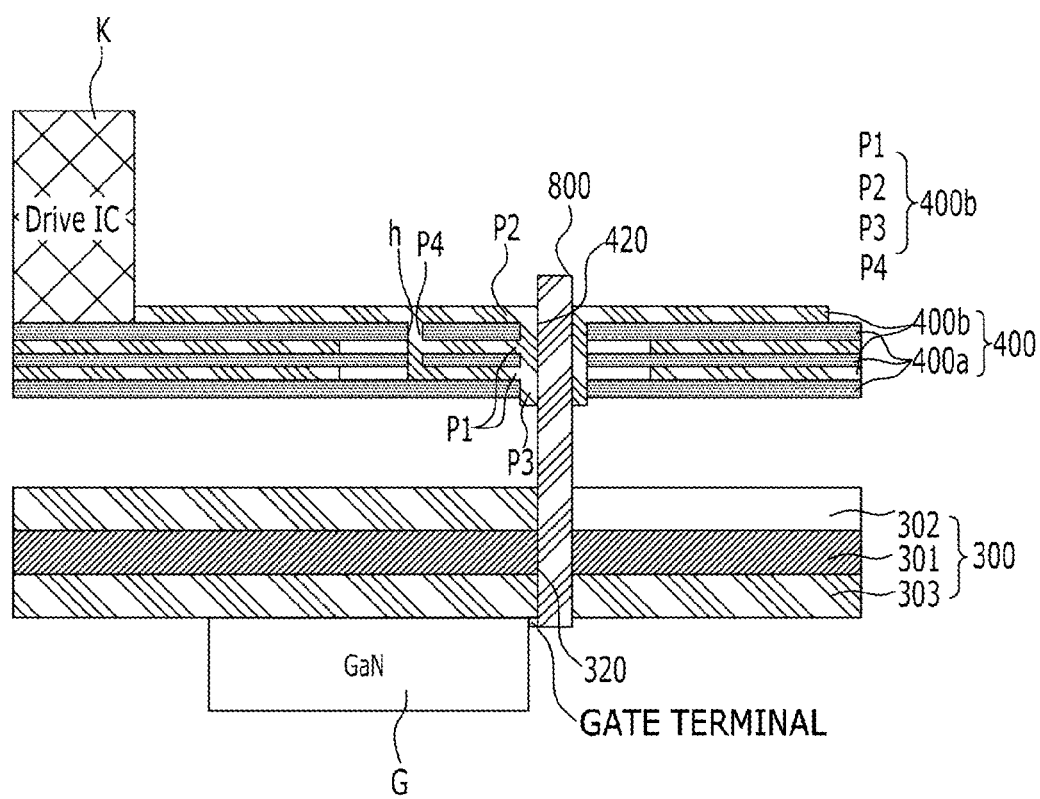

POWER MODULE

TECHNICAL FIELD

The present disclosure relates to a power module, and more particularly, to a power module having improved performance by applying a high output power semiconductor chip and a method of manufacturing the same.

BACKGROUND ART

A power module is used to supply a high voltage and current in order to drive a motor in a hybrid vehicle or an electric vehicle.

A double-sided cooling power module among the power modules has substrates installed on and below a semiconductor chip, respectively, and has heat sinks provided on the outsides of the substrates, respectively. The use of the double-sided cooling power module tends to be gradually increased because the double-sided cooling power module has more excellent cooling performance than a cross-section cooling power module having a heat sink provided on one side thereof.

The double-sided cooling power module that is used in an electric vehicle, etc. generates high heat due to a high voltage and vibration during driving because a power semiconductor chip made of silicon carbide (SiC), gallium nitride (GaN), etc. is mounted between the two substrates. In order to solve such a problem, it is important to satisfy both high strength and high heat dissipation characteristics.

DISCLOSURE

Technical Problem

An object of the present disclosure is to provide a power module which has high strength and high heat dissipation characteristics and has an excellent bonding characteristic and which can reduce a volume by minimizing a current path and can improve efficiency and performance.

Furthermore, an object of the present disclosure is to provide a power module which allows great power to be easily controlled at high speed by minimizing a current path and reducing impedance and inductance in a way to construct a high output power semiconductor chip module and a drive printed circuit board assembly (PCBA) in an integrated type.

Furthermore, an object of the present disclosure is to provide a power module having a great capacitor effect by shortening a current path when capacitors are mounted on a PCB substrate.

Furthermore, an object of the present disclosure is to provide a power module in which a gate terminal and source terminal of a semiconductor chip are constructed to have the same line impedance, in order to increase a capacity by connecting multiple semiconductor chips in parallel and to increase a high speed switching speed in a circuit in which the multiple semiconductor chips are connected in parallel.

Furthermore, an object of the present disclosure is to provide a power module which reduces impedance between an output terminal of a gate drive IC that controls the on/off of a semiconductor chip, that is, a switching element, and a gate terminal of the semiconductor chip in a circuit that requires a high speed switching speed.

Technical Solution

According to a characteristic of the present disclosure for achieving the object, a power module of the present disclosure includes a lower ceramic substrate, an upper ceramic substrate disposed over the lower ceramic substrate, a PCB substrate disposed over the upper ceramic substrate in a way to be spaced apart from the upper ceramic substrate, multiple semiconductor chips mounted on the lower surface of the upper ceramic substrate, spaced apart from each other, and disposed in parallel, and multiple capacitors mounted on the upper surface of the PCB substrate so that the multiple capacitors correspond to locations between the multiple semiconductor chips. The power module further includes a housing configured to integrate and package the lower ceramic substrate, the upper ceramic substrate, and the PCB substrate.

The power module further includes multiple first through holes formed in the upper ceramic substrate, multiple second through holes formed in the PCB substrate and formed at locations that communicate with the first through holes of the upper ceramic substrate, and a connection pin inserted into the first through hole and the second through hole and configured to perpendicularly connect an electrode pattern on which the multiple semiconductor chips have been mounted and an electrode pattern on which the multiple capacitors have been mounted.

The upper ceramic substrate includes a first electrode pattern, a second electrode pattern, and a third electrode pattern, and the first through holes are formed in a row in each of the first electrode pattern and the third electrode pattern.

The upper ceramic substrate includes a first electrode pattern, a second electrode pattern, and a third electrode pattern. The multiple semiconductor chips include a first semiconductor chip and a second semiconductor chip that are disposed to connect the first electrode pattern and the second electrode pattern and that constitute a high side circuit, and a third semiconductor chip and a fourth semiconductor chip that are disposed to connect the second electrode pattern and the third electrode pattern and that constitute a low side circuit.

A drain part of the high side circuit and a source part of the low side circuit are connected to an electrode pattern on which multiple capacitors are mounted in the PCB substrate, by a connection pin.

The power module further includes a gate terminal formed in the upper ceramic substrate, a gate drive IC mounted on the PCB substrate, and a third through hole and a fourth through hole that are formed in the gate terminal and the PCB substrate, respectively, and into which a connection pin for connecting the gate terminal and the gate drive IC is inserted.

The gate drive IC includes a high side gate drive IC and a low side gate drive IC that output a signal to switch the semiconductor chip.

The power module further includes a source terminal formed in the upper ceramic substrate, a gate drive IC mounted on the PCB substrate, and a fifth through hole and a sixth through hole that are formed in the source terminal and the PCB substrate, respectively, and into which a connection pin for connecting the source terminal and the gate drive IC is inserted.

The power module further includes a seventh through hole formed in the upper ceramic substrate and connected to a terminal of a temperature sensor, and an eighth through hole formed in the PCB substrate at a location corresponding to the seventh through hole and connected to an electrode pattern on which a driving element is mounted.

The power module further includes a gate terminal disposed between the first semiconductor chip and the second semiconductor chip and connected to the first semiconductor chip and the second semiconductor chip at the same pattern length, a source terminal disposed between the first semiconductor chip and the second semiconductor chip and connected to the first semiconductor chip and the second semiconductor chip at the same pattern length, a gate terminal disposed between the third semiconductor chip and the fourth semiconductor chip and connected to the third semiconductor chip and the fourth semiconductor chip at the same pattern length, and a source terminal disposed between the third semiconductor chip and the fourth semiconductor chip and connected to the third semiconductor chip and the fourth semiconductor chip at the same pattern length.

The gate terminal and the source terminal are spaced apart from each other.

The gate terminal and the source terminal include a through hole having a connection pin inserted into a center thereof.

The semiconductor chip includes a GaN chip.

The lower ceramic substrate and the upper ceramic substrate are one of an active metal brazing (AMB) substrate, a direct bonded copper (DBC) substrate, and a thick printing copper substrate.

A power module of another embodiment includes a PCB substrate having a multi-layer structure in which an internal electrode pattern is formed between a plurality of insulating layers and an upper electrode pattern is formed in a highest layer of the multi-layer structure, a through hole configured to penetrate the PCB substrate, a connection pin disposed in the through hole and connected to an upper electrode pattern, and a detour circuit configured to connect the upper electrode pattern to the through hole through the internal electrode pattern.

The detour circuit includes a conductive layer formed on an internal wall surface of the through hole, the internal electrode pattern connected to the conductive layer, and a connection layer filled into a via hole formed to connect the internal electrode pattern and the upper electrode pattern and configured to connect the internal electrode pattern and the upper electrode pattern.

The internal electrode pattern is multiple, and the multiple internal electrode patterns are connected to the conductive layer in parallel.

The via hole is formed at a location spaced apart from the through hole.

The PCB substrate may be an FR4 substrate.

The lowest layer of the PCB substrate may be the insulating layer.

Advantageous Effects

The present disclosure has effects in that it has high strength and high heat dissipation characteristics and has an excellent bonding characteristic, can reduce a volume by minimizing a current path, and can improve efficiency and performance due to optimization for high speed switching.

Furthermore, the present disclosure has an effect in that it can improve efficiency and performance of the power module because great power can be easily controlled at high speed by minimizing a current path and reducing impedance and inductance in a way to manufacture the lower ceramic substrate, the upper ceramic substrate, and the PCB substrate in the form of a three-layer integration type structure.

Furthermore, according to the present disclosure, when the capacitors are mounted on the PCB substrate, the capacitors are disposed to correspond to locations between the semiconductor chips. A circuit stabilization effect is great by shortening a current path along which the semiconductor chips and the capacitors are connected. In particular, a circuit stabilization effect can be increased in a high speed switching circuit in which the GaN chip is used.

Furthermore, the present disclosure has effects in that it can increase a capacity by connecting multiple semiconductor chips in parallel and can improve efficiency and performance of a great power switching circuit that requires a high speed switching speed because a gate terminal and source terminal of a semiconductor chip are connected to the semiconductor chip at the same pattern length in a circuit in which the multiple semiconductor chips are connected in parallel.

Furthermore, according to the present disclosure, the upper electrode pattern and the internal electrode pattern are connected and the internal electrode pattern is connected to the through hole by forming, in the PCB substrate, the via hole that connects the upper electrode pattern and the internal electrode pattern. Accordingly, impedance can be reduced because the length of the electrode pattern is reduced to the maximum and the area of the electrode pattern is also increased. This has an effect in that high speed switching is possible by increasing the speed at which the switching signal reaches the GaN chip.

Furthermore, the present disclosure can implement insulating performance while minimizing the distance between the PCB substrate and the ceramic substrate because the lowest layer applies the PCB substrate having a multi-layer structure, that is, an insulating layer. If the distance between the PCB substrate and the ceramic substrate is minimized, there are effects in that an output loss is removed and high speed switching is possible because the output terminal of the gate drive IC and the gate terminal of the semiconductor chip are connected at the shortest distance.

DESCRIPTION OF DRAWINGS

FIG. 1 is a perspective view of a power module according to an embodiment of the present disclosure.

FIG. 2 is an exploded perspective view of the power module according to an embodiment of the present disclosure.

FIG. 3 is a side cross-sectional view of the power module according to an embodiment of the present disclosure.

FIG. 4 is a perspective view illustrating a housing according to an embodiment of the present disclosure.

FIG. 5 is a perspective view illustrating a lower ceramic substrate according to an embodiment of the present disclosure.

FIG. 6 is a diagram illustrating the upper surface and the lower surface of the lower ceramic substrate according to an embodiment of the present disclosure.

FIG. 7 is a perspective view illustrating an upper ceramic substrate according to an embodiment of the present disclosure.

FIG. 8 is a diagram illustrating the upper surface and the lower surface of the upper ceramic substrate according to an embodiment of the present disclosure.

FIG. 9 is a plan view of a PCB substrate according to an embodiment of the present disclosure.

FIG. 10 is a perspective view illustrating the state in which pin connections have been coupled to the upper ceramic substrate according to an embodiment of the present disclosure.

FIG. 11 is a diagram for describing locations of the semiconductor chip and capacitors mounted on the PCB substrate according to an embodiment of the present disclosure.

FIG. 12 illustrates a circuit diagram of a power module according to an embodiment of the present disclosure.

FIG. 13 is a construction diagram for describing a structure of a power module according to an embodiment of the present disclosure.

FIG. 14 is a diagram for describing a construction in which a detour circuit has been formed by adding a via hole in the PCB substrate as another embodiment of the present disclosure.

| *Description of reference numerals* | |
|---|---|
| 10: power module | 100: housing |
| 101: guide rib | 102: locking projection |
| 103: fastening hole | 104: support hole |
| 200: lower ceramic substrate | 201: ceramic base |
| 202, 203: metal layer | 210: NTC temperature sensor |
| 220: insulating spacer | 230: interconnection spacer |
| 300: upper ceramic substrate | 301: ceramic base |
| 302, 303: metal layer | 310: cutting part (injection hole) |
| 320: through holes | 330: via hole |
| 350: vent hole | 400: PCB substrate |
| 401, 402: guide groove | 410: capacitor |
| 420: through hole | 500: heat sink |
| 501: communication hole | 610: first terminal |
| 620: second terminal | 630: support bolt |
| 700: bus bar | G: semiconductor chip (GaN chip) |
| 800: connection pin | S: silicon fluid |
| P1: internal electrode pattern | P2: upper electrode pattern |
| P3: conductive layer | P4: connection layer |
| h: via hole | |

BEST MODE

Hereinafter, embodiments of the present disclosure are described in detail with reference to the accompanying drawings.

FIG. 1 is a perspective view of a power module according to an embodiment of the present disclosure. FIG. 2 is an exploded perspective view of the power module according to an embodiment of the present disclosure.

As illustrated in FIGS. 1 and 2, the power module 10 according to an embodiment of the present disclosure is an electronic part having a package form, which is formed by accommodating, in a housing 100, various components that form the power module. The power module 10 is formed in a form in which substrates and elements are disposed and protected within the housing 100.

The power module 10 may include multiple substrates and multiple semiconductor chips. The power module 10 according to an embodiment includes the housing 100, a lower ceramic substrate 200, an upper ceramic substrate 300, a PCB substrate 400, and a heat sink 500.

An empty space that is opened up and down is formed at the center of the housing 100. First terminals 610 and a second terminal 620 are disposed on both sides of the housing 100. The heat sink 500, the lower ceramic substrate 200, the upper ceramic substrate 300, and the PCB substrate 400 are sequentially stacked in the empty space at the center of the housing 100 at regular intervals. Support bolts 630 for connecting external terminals are fastened to the first terminals 610 and the second terminal 620 on both sides of the housing 100. The first terminals 610 and the second terminal 620 are used as the input and output stages of a power source.

As illustrated in FIG. 2, in the power module 10, the lower ceramic substrate 200, the upper ceramic substrate 300, and the PCB substrate 400 are sequentially accommodated in the empty space at the center of the housing 100. Specifically, the heat sink 500 is disposed at the lower surface of the housing 100. The lower ceramic substrate 200 is attached to the upper surface of the heat sink 500. The upper ceramic substrate 300 is disposed over the lower ceramic substrate 200 at a regular interval. The PCB substrate 400 is disposed over the upper ceramic substrate 300 at a regular interval.

The state in which the PCB substrate 400 has been disposed in the housing 100 may be fixed by guide grooves 401 and 402 formed at an edge of the PCB substrate 400 in a way to be concaved and a guide rib 101 and a locking projection 102 that are formed in the housing 100 in a way to correspond to the guide grooves 401 and 402. The multiple guide grooves 401 and 402 are formed to enclose the edge of the PCB substrate 400 according to an embodiment. The guide rib 101 formed on the inner surface of the housing 100 is guided through some guide grooves 401 of the multiple guide grooves 401 and 402. The locking projection 102 formed on the inner surface of the housing 100 passes through the remaining some guide grooves 402 of the multiple guide grooves 401 and 402, and is hung thereto.

Alternatively, the state in which the heat sink 500, the lower ceramic substrate 200, and the upper ceramic substrate 300 are accommodated in the empty space at the center of the housing 100 and the PCB substrate 400 is disposed at the upper surface thereof may also be fixed by a fastening bolt (not illustrated). However, fixing the PCB substrate 400 to the housing 100 through the guide groove and the locking projection structure reduces an assembly time and has a simple assembly process compared to a case in which the PCB substrate 400 is fixed to the housing 100 by the fastening bolt.

Fastening holes 103 are formed at four corners of the housing 100. The fastening holes 103 communicate with the communication holes 501 formed in the heat sink 500. Fixing bolts 150 are fastened to penetrate the fastening holes 103 and the communication holes 501. The ends of the fixing bolts 150 that have penetrated the fastening holes 103 and the communication holes 501 may be fastened to fixing holes of a fixing jig to be disposed at the lower surface of the heat sink 500.

Bus bars 700 are connected to the first terminals 610 and the second terminal 620. The bus bars 700 connect the first terminals 610 and the second terminal 620 to the upper ceramic substrate 300. Three bus bars 700 are provided. One of the bus bars 700 connects a + terminal, among the first terminals 610, to a first electrode pattern a of the upper ceramic substrate 300, and another of the bus bars 700 connects a − terminal, among the first terminals 610, to a third electrode pattern c. The remainder of the bus bars 700 connects the second terminal 620 to a second electrode pattern b. For the first electrode pattern a, the second electrode pattern b, and the third electrode pattern c, reference is made to FIGS. 7 and 10 to be described later.

FIG. 3 is a side cross-sectional view of the power module according to an embodiment of the present disclosure.

As illustrated in FIG. 3, the power module 10 is a duplex structure of the lower ceramic substrate 200 and the upper ceramic substrate 300. A semiconductor chip G is disposed between the lower ceramic substrate 200 and the upper ceramic substrate 300. The semiconductor chip G may be any one of a gallium nitride (GaN) chip, a metal oxide semiconductor field effect transistor (MOSFET), an insulated gate bipolar transistor (IGBT), a junction field effect transistor (JFET), and a high electric mobility transistor (HEMT), but the GaN chip is preferably used as the semiconductor chip G. The gallium nitride (GaN) chip G is a semiconductor chip that functions as a high power (300 A) switch and a high-speed (~1 MHz) switch. The GaN chip has advantages in that it is more resistant to heat than the existing silicon-based semiconductor chip and can also reduce the size of the chip.

Each of the lower ceramic substrate 200 and the upper ceramic substrate 300 is formed of a ceramic substrate including a ceramic base and a metal layer brazing-bonded to at least one surface of the ceramic base so that heat dissipation efficiency of heat generated from the semiconductor chip G can be increased.

The ceramic base may be any one of alumina (Al2O3), AlN, SiN, and Si3N4, for example. The metal layer is a metal foil brazing-bonded to a surface of the ceramic base, and is formed in the form of an electrode pattern on which the semiconductor chip G is mounted and an electrode pattern on which a driving element is mounted. For example, the metal layer is formed in the form of an electrode pattern in an area on which a semiconductor chip or a peripheral part will be mounted. The metal foil is an aluminum foil or a copper foil, for example. The metal foil is sintered on the ceramic base at 780° C. to 1100° C. and brazing-bonded to the ceramic base, for example. Such a ceramic substrate is called an AMB substrate. An embodiment is described by taking the AMB substrate as an example, but may apply a DBC substrate, a TPC substrate, or a DBA substrate. However, in terms of durability and heat dissipation efficiency, the AMB substrate is most appropriate. For the reason, the lower ceramic substrate 200 and the upper ceramic substrate 300 are AMB substrates, for example.

The PCB substrate 400 is disposed over the upper ceramic substrate 300. That is, the power module 10 is constituted with a three-layer structure of the lower ceramic substrate 200, the upper ceramic substrate 300, and the PCB substrate 400. Heat dissipation efficiency is increased by disposing the semiconductor chip G for control for high power between the upper ceramic substrate 300 and the lower ceramic substrate 200. Damage to the PCB substrate 400 attributable to heat which occurs in the semiconductor chip G is prevented by disposing the PCB substrate 400 for control for low power at the top of the power module 10. The lower ceramic substrate 200, the upper ceramic substrate 300, and the PCB substrate 400 may be connected or fixed by pins.

The heat sink 500 is disposed under the lower ceramic substrate 200. The heat sink 500 is for discharging heat that is generated from the semiconductor chip G. The heat sink 500 is formed in a quadrangle plate shape having a predetermined thickness. The heat sink 500 is formed to have an area corresponding to the housing 100, and may be formed of a copper or aluminum material in order to increase heat dissipation efficiency.

Hereinafter, characteristics for each component of the power module of the present disclosure are more specifically described. In a drawing that describes the characteristics for each component of the power module, there is a portion that has been expressed by enlarging or exaggerating the drawing in order to highlight the characteristics of each component. Accordingly, a portion that is not partially identical with some of the basic drawing illustrated in FIG. 1 may be present.

FIG. 4 is a perspective view illustrating a housing according to an embodiment of the present disclosure.

As illustrated in FIG. 4, the housing 100 has an empty space formed at the center thereof, and has the first terminals 610 and the second terminal 620 disposed at both ends thereof. The housing 100 may have the first terminals 610 and the second terminal 620 formed at both ends thereof by using an insert injection method in a way to be integrally fixed thereto.

In the existing power module, a connection pin is applied to the housing through insert injection in order to connect isolated circuits. In contrast, in the present embodiment, the housing 100 has a shape that is manufactured by excluding the connection pin upon manufacturing. This improves flexibility for torsion moment of the power module by simplifying a shape of the power module because the connection pin is not disposed within the housing 100.

The housing 100 has the fastening holes 103 formed at the four corners thereof. The fastening holes 103 communicate with the communication holes 501 formed in the heat sink 500. The first terminals 610 and the second terminal 620 have support holes 104 formed therein. The support bolts 630 for connecting the first terminals 610 and the second terminal 620 to external terminals, such as a motor, are fastened to support bolts 630 (refer to FIG. 10).

The housing 100 is formed of an insulating material. The housing 100 may be formed of an insulating material so that heat generated from the semiconductor chip G is not delivered to the PCB substrate 400 over the housing 100, through the housing 100.

Alternatively, a heat dissipation plastic material may be applied to the housing 100. The heat dissipation plastic material may be applied to the housing 100 so that heat generated from the semiconductor chip G can be discharged to the outside through the housing 100. For example, the housing 100 may be formed of engineering plastics. The engineering plastics has high heat resistance, excellent strength, chemical resistance, and wear resistance, and may be used for a long time at 150° C. or more. The engineering plastics may be made of one material among polyamide, polycarbonate, polyester, and modified polyphenylene oxide.

The semiconductor chip G performs a repetitive operation as a switch. Accordingly, the housing 100 is subjected to stress attributable to a high temperature and a temperature change, but the engineering plastics is relatively stable with respect to a high temperature and a temperature change and is excellent in a heat dissipation characteristic compared to common plastics because the engineering plastics has excellent high temperature stability.

In an embodiment, the housing 100 may have been manufactured by applying a terminal made of aluminum or copper to the engineering plastic material through insert injection. The housing 100 made of the engineering plastic material discharges heat to the outside by propagating heat. The housing 100 may more increase thermal conductivity than a common engineering plastic material and may become light-weight and high heat dissipation engineering plastics, compared to aluminum by filling resin with a high heat conductivity filler.

Alternatively, the housing 100 may have a heat dissipation characteristic by coating a graphene heat dissipation coating material on the inside or outside of engineering plastics or high strength plastic material.

FIG. 5 is a perspective view illustrating a lower ceramic substrate according to an embodiment of the present disclosure.

As illustrated in FIGS. 3 and 5, the lower ceramic substrate 200 is attached to the upper surface of the heat sink 500. Specifically, the lower ceramic substrate 200 is disposed between the semiconductor chip G and the heat sink 500. The lower ceramic substrate 200 plays a role to deliver, to the heat sink 500, heat generated from the semiconductor chip G and to prevent a short by insulating the semiconductor chip G and the heat sink 500.

The lower ceramic substrate 200 may be soldered and bonded to the upper surface of the heat sink 500. The heat sink 500 is formed to have an area corresponding to the housing 100, and may be formed of a copper material in order to increase heat dissipation efficiency. SnAg, SnAgCu, etc. may be used as a solder for the soldering and bonding.

FIG. 6 is a diagram illustrating the upper surface and the lower surface of the lower ceramic substrate according to an embodiment of the present disclosure.

As illustrated in FIGS. 5 and 6, the lower ceramic substrate 200 includes a ceramic base 201 and metal layers 202 and 203 brazing-bonded to the upper surface and the lower surface of the ceramic base 201. In the lower ceramic substrate 200, the ceramic base 201 may have a thickness of 0.68 t, and each of the metal layers 202 and 203 formed at the upper surface and the lower surface of the ceramic base 201 may have a thickness of 0.8 t, for example.

The metal layer 202 at the upper surface 200a of the lower ceramic substrate 200 may be an electrode pattern on which a driving element is mounted. The driving element mounted on the lower ceramic substrate 200 may be an NTC temperature sensor 210. The NTC temperature sensor 210 is mounted on the upper surface of the lower ceramic substrate 200. The NTC temperature sensor 210 is for providing information on a temperature within the power module attributable to heat generated from the semiconductor chip G. The metal layer 203 at the lower surface 200b of the lower ceramic substrate 200 may be formed on the entire lower surface of the lower ceramic substrate 200 in order to facilitate the delivery of heat to the heat sink 500.

An insulating spacer 220 is bonded to the lower ceramic substrate 200. The insulating spacer 220 is bonded to the upper surface of the lower ceramic substrate 200, and defines an isolation distance between the lower ceramic substrate 200 and the upper ceramic substrate 300.

The insulating spacer 220 defines the isolation distance between the lower ceramic substrate 200 and the upper ceramic substrate 300, thereby increasing heat dissipation efficiency of heat generated from the semiconductor chip G mounted on the lower surface of the upper ceramic substrate 300 and preventing an electrical shock, such as a short, by preventing interference between the semiconductor chips G.

Multiple insulating spacers 220 are bonded at predetermined intervals by enclosing an edge at the upper surface of the lower ceramic substrate 200. An interval between the insulating spacers 220 is used as a space for increasing heat dissipation efficiency. In the drawing, the insulating spacers 220 are disposed to enclose the edge of the lower ceramic substrate 200. For example, eight insulating spacers 220 are disposed at regular intervals.

The insulating spacers 220 are integrally bonded to the lower ceramic substrate 200. The insulating spacers 220 may be applied for the purpose of checking the alignment of the upper ceramic substrate 300 when the upper ceramic substrate 300 is disposed over the lower ceramic substrate 200. In the state in which the insulating spacers 220 have been bonded to the lower ceramic substrate 200, when the upper ceramic substrate 300 on which the semiconductor chip G has been mounted is disposed over the lower ceramic substrate 200, the insulating spacers 220 may be applied for the purpose of checking the alignment of the upper ceramic substrate 300. Furthermore, the insulating spacers 220 contribute to preventing the bending of the lower ceramic substrate 200 and the upper ceramic substrate 300 by supporting the lower ceramic substrate 200 and the upper ceramic substrate 300.

The insulating spacers 220 may be formed of a ceramic material in order to insulate a chip mounted on the lower ceramic substrate 200 and a chip mounted on the upper ceramic substrate 300 and a part. For example, the insulating spacers may be formed of one kind selected among Al2O3, ZTA, Si3N4, and AlN or a mixed alloy of two or more of them. Al2O3, ZTA, Si3N4, and AlN are insulating materials having excellent mechanical strength and heat-resisting properties.

The insulating spacers 220 are brazing-bonded to the lower ceramic substrate 200. The insulating spacers 220 are brazing-bonded to the lower ceramic substrate 200 because the substrate may be broken due to thermal and mechanical shocks upon soldering or pressurization sintering if the insulating spacers 220 are soldered and bonded to the lower ceramic substrate 200. A brazing bonding layer including an AgCu layer and a Ti layer may be used for the brazing bonding. Heat treatment for the brazing may be performed at 780° C. to 900° C. After the brazing, the insulating spacers 220 are integrally formed with the metal layer 202 of the lower ceramic substrate 200. The thickness of the brazing bonding layer is 0.005 mm to 0.08 mm, which is thin to the extent that the height of the insulating spacers is not affected and has high bonding strength.

An interconnection spacer 230 is installed between the lower ceramic substrate 200 and the upper ceramic substrate 300. The interconnection spacer 230 may perform an electrical connection between electrode patterns instead of a connection pin in a substrate having an upper and lower duplex structure. The interconnection spacer 230 can increase bonding strength and improve electrical characteristics by directly connecting the substrates, while preventing an electrical loss and shot. The interconnection spacer 230 may have one end bonded to the electrode pattern of the lower ceramic substrate 200 by using a brazing bonding method. Furthermore, the interconnection spacer 230 may have the other end opposite to the one end bonded to the electrode pattern of the upper ceramic substrate 300 by using a brazing bonding method or a soldering bonding method. The interconnection spacer 230 may be a Cu or Cu+CuMo alloy.

FIG. 7 is a perspective view illustrating an upper ceramic substrate according to an embodiment of the present disclosure. FIG. 8 is a diagram illustrating the upper surface and the lower surface of the upper ceramic substrate according to an embodiment of the present disclosure.

As illustrated in FIGS. 7 and 8, the upper ceramic substrate 300 is disposed over the lower ceramic substrate 200.

The upper ceramic substrate 300 is an intermediate substrate having a stack structure. The upper ceramic substrate 300 has the semiconductor chip G mounted on a lower surface thereof and a high side circuit and a low side circuit for high-speed switching constructed on the lower surface.

The upper ceramic substrate 300 includes a ceramic base 301 and metal layers 302 and 303 brazing-bonded to the upper surface and the lower surface of the ceramic base 301. In the upper ceramic substrate 300, the ceramic base has a thickness of 0.38 t, and each of electrode patterns of the upper surface 300a and the lower surface 300b of the ceramic base has a thickness of 0.3 t, for example. The ceramic substrate is not twisted upon brazing only when the patterns at the upper surface and the lower surface thereof have the same thickness.

The electrode patterns that are formed by the metal layer 302 at the upper surface of the upper ceramic substrate 300 are divided into the first electrode pattern a, the second electrode pattern b, and the third electrode pattern c. The electrode patterns that are formed by the metal layer 303 at the lower surface of the upper ceramic substrate 300 correspond to the electrode patterns that are formed by the metal layer 302 at the upper surface of the upper ceramic substrate 300. Dividing the electrode patterns at the upper surface of the upper ceramic substrate 300 into the first electrode pattern a, the second electrode pattern b, and the third electrode pattern c is for division into a high side circuit and a low side circuit for high-speed switching.

The semiconductor chip G is provided at the lower surface 300b of the upper ceramic substrate 300 in a flip chip form by an adhesive layer, such as a solder or an Ag paste. As the semiconductor chip G is provided in the flip chip form at the lower surface of the upper ceramic substrate 300, an inductance value can be lowered as much as possible because wire bonding is omitted. Accordingly, heat dissipation performance can also be improved.

As illustrated in FIG. 8, the semiconductor chip G may be connected in parallel by two for high-speed switching. Two semiconductor chips G are disposed at a location at which the first electrode pattern a and the second electrode pattern b, among the electrode patterns of the upper ceramic substrate 300, are connected. The remaining two semiconductor chips G are disposed in parallel at a location at which the second electrode pattern b and the third electrode pattern c are connected. For example, the capacity of one semiconductor chip G is 150 A. Accordingly, the capacity of two semiconductor chips G become 300 A by connecting the two semiconductor chips G in parallel. The semiconductor chip G is a GaN chip.

The purpose of the power module using the semiconductor chip G is for high-speed switching. For the high-speed switching, it is important to connect the gate drive IC terminal and a gate terminal of the semiconductor chip G at a very short distance. Accordingly, a connection distance between the gate drive IC and the gate terminal is minimized by connecting the semiconductor chips G in parallel. Furthermore, in order for the semiconductor chip G to switch at high speed, it is important for the gate terminal and source terminal of the semiconductor chip G to maintain the same interval. To this end, the gate terminal and the source terminal may be disposed so that a connection pin is connected to the middle between the semiconductor chip G and the semiconductor chips G. A problem occurs if the gate terminal and the source terminal do not maintain the same interval or the length of a pattern is changed.

The gate terminal is a terminal that turns on/off the semiconductor chip G by using a low voltage. The gate terminal may be connected to the PCB substrate 400 through the connection pin. The source terminal is a terminal to and from which a high current is input and output. The semiconductor chip G includes a drain terminal. The source terminal and the drain terminal may change the directions of currents thereof by being divided into an N type and a P type. The source terminal and the drain terminal are responsible for the input and output of a current through the first electrode pattern a, the second electrode pattern b, and the third electrode pattern c, that is, the electrode patterns on which the semiconductor chip G is mounted. The source terminal and the drain terminal are connected to the first terminal 610 and the second terminal 620 in FIG. 1, which are responsible for the input and output of a power source.

Referring to FIGS. 1 and 8, the first terminal 610 illustrated in FIG. 1 includes a + terminal and a − terminal. A power source that is introduced into the + terminal of the first terminal 610 is output to the second terminal 620 through the first electrode pattern a of the upper ceramic substrate 300 illustrated in FIG. 8, the semiconductor chip G disposed between the first electrode pattern a and the second electrode pattern b, and the second electrode pattern b. Furthermore, a power source introduced into the second terminal 620 illustrated in FIG. 1 is output to the − terminal of the first terminal 610 through the second electrode pattern b illustrated in FIG. 8, the semiconductor chip G disposed between the second electrode pattern b and the third electrode pattern c, and the third electrode pattern c. For example, a power that is introduced from the first terminal 610 and output to the second terminal 620 through the semiconductor chip G becomes a high side. A power source that is introduced from the second terminal 620 and output to the first terminal 610 through the semiconductor chip G becomes a low side.

As illustrated in FIG. 7, the upper ceramic substrate 300 may have a cutting part 310 formed at a portion corresponding to the NTC temperature sensor 210. The NTC temperature sensor 210 is mounted on the upper surface of the lower ceramic substrate 200. The NTC temperature sensor 210 is for providing information on a temperature within the power module, which is attributable to heat generated from the semiconductor chip G. However, interference occurs between the NTC temperature sensor 210 and the upper ceramic substrate 300 because the thickness of the NTC temperature sensor 210 is greater than an interval between the lower ceramic substrate 200 and the upper ceramic substrate 300. In order to solve such a problem, the cutting part 310 is formed by cutting a portion of the upper ceramic substrate 300 that interferes with the NTC temperature sensor 210.

A silicon fluid or epoxy for molding may be injected into the space between the upper ceramic substrate 300 and the lower ceramic substrate 200 through the cutting part 310. In order to insulate the upper ceramic substrate 300 and the lower ceramic substrate 200, the silicon fluid or the epoxy needs to be injected. In order to inject the silicon fluid or the epoxy into the upper ceramic substrate 300 and the lower ceramic substrate 200, the cutting part 310 may be formed by cutting one surface of the upper ceramic substrate 300. The cutting part 310 is formed at a location corresponding to the NTC temperature sensor 210, and can also prevent interference between the upper ceramic substrate 300 and the NTC temperature sensor 210. The silicon fluid or the epoxy may be filled into the space between the lower ceramic substrate 200 and the upper ceramic substrate 300 and the space between the upper ceramic substrate 300 and the PCB substrate 400 for the purposes of protecting the semiconductor chip G, reducing vibration, and insulation.

A through hole 320 is formed in the upper ceramic substrate 300. The through hole 320 is for connecting the semiconductor chip G mounted on the upper ceramic substrate 300 and a driving element mounted on the PCB substrate 400 at the shortest distance and connecting the NTC temperature sensor 210 mounted on the lower ceramic substrate 200 and a driving element mounted on the PCB substrate 400 at the shortest distance in an upper and lower duplex substrate structure.

Eight through holes 320 are formed at locations at which the semiconductor chip is installed by two. Two through holes 320 are installed at a location at which the NTC temperature sensor is installed. A total of ten through holes 320 may be formed. Furthermore, multiple through holes 320 may be formed at portions of the upper ceramic substrate 300 in which the first electrode pattern a and the third electrode pattern c have been formed.

The multiple through holes 320 formed in the first electrode pattern a enable a current that is introduced into the first electrode pattern a at the upper surface of the upper ceramic substrate 300 to move to the first electrode pattern a formed at the lower surface of the upper ceramic substrate 300 and to be introduced into the semiconductor chip G. The multiple through holes 320 formed in the third electrode pattern c enable a current that is introduced into the semiconductor chip G to move to the third electrode pattern c at the upper surface of the upper ceramic substrate 300 through the third electrode pattern c at the lower surface of the upper ceramic substrate 300.

The diameter of the through hole 320 may be 0.5 mm to 5.0 mm A connection pin is installed in the through hole 320, and is connected to the electrode pattern of the PCB substrate, which may be connected to a driving element mounted on the PCB substrate 400 through the through hole 320. In the upper and lower duplex substrate structure, the connection between the electrode patterns through the through hole 320 and the connection pin installed in the through hole 320 can contribute to improving restrictions according to the size of the power module by removing various output losses through the shortest distance connection.

A plurality of via holes 330 may be formed in the electrode pattern of the upper ceramic substrate 300. The via holes 330 may be processed to be at least 50% or more compared to the area of the substrate. It has been described that the area of the via holes 330 is applied as being at least 50% or more compared to the area of the substrate, for example, but the present disclosure is not limited thereto and the area of the via holes 330 may be processed to be 50% or less compared to the area of the substrate.

For example, 152 via holes may be formed in the first electrode pattern a, 207 via holes may be formed in the second electrode pattern b, and 154 via holes may be formed in the third electrode pattern c. The plurality of via holes 330 formed in each of the electrode patterns is for high current electrification and a high current distribution. If the electrode pattern at the upper surface of the upper ceramic substrate 300 and the electrode pattern at the lower surface of the upper ceramic substrate 300 become conductive to each other in one slot form, a problem, such as a short or overheating, may occur because a high current flows into only one side.

The via hole 330 is filled with a conductive substance. The conductive substance may be Ag or an Ag alloy. The Ag alloy may be an Ag—Pd paste. The conductive substance that is filled into the via hole 330 electrically connects the electrode pattern at the upper surface of the upper ceramic substrate 300 and the electrode pattern at the lower surface of the upper ceramic substrate 300. The via hole 330 may be formed by laser processing. The via hole 330 may be seen in the enlarged view of FIG. 8.

FIG. 9 is a plan view of a PCB substrate according to an embodiment of the present disclosure.

As illustrated in FIG. 9, a driving element for switching the semiconductor chip G or switching a GaN chip (a semiconductor chip) by using information detected by the NTC temperature sensor (reference numeral 210 in FIG. 7) is mounted on the PCB substrate 400. The driving element includes a gate drive IC.

A capacitor 410 is mounted on the upper surface of the PCB substrate 400. The capacitor 410 is mounted on the upper surface of the PCB substrate 400, that is, a location between the semiconductor chip G disposed to connect the first electrode pattern a and second electrode pattern b of the upper ceramic substrate 300 and the semiconductor chips G is disposed to connect the second electrode pattern b and third electrode pattern c of the upper ceramic substrate 300.

If the capacitor 410 is mounted on the upper surface of the PCB substrate 400, that is, a location between the semiconductor chips G, high speed switching is more advantageous because the semiconductor chip G and the drive IC circuit can be connected at the shortest distance by using the connection pin (reference numeral 800 in FIG. 10). For example, ten capacitors 410 may be connected in parallel in order to meet the capacity thereof. In order to secure 2.5 µF or more for the input stage for a decoupling use, the capacity needs to be secured by connecting ten capacitors having a high voltage. The gate drive IC circuit includes a high side gate drive IC and a low side gate drive IC.

FIG. 10 is a perspective view illustrating the state in which a connection pin has been coupled to the upper ceramic substrate according to an embodiment of the present disclosure.

As illustrated in FIG. 10, a connection pin 800 is inserted into the through hole (reference numeral 320 in FIG. 7) formed at a location adjacent to the semiconductor chip G in the upper ceramic substrate 300. The connection pin 800 inserted into the through hole 320 formed at the location adjacent to the semiconductor chip G may be inserted into a through hole 420 formed at a location corresponding to the PCB substrate (reference numeral 400 in FIG. 9), and may connect the gate terminal on which the semiconductor chip G is mounted and the electrode pattern of the PCB substrate 400.

Furthermore, the connection pin 800 is inserted into the through hole 320 formed at a location adjacent to the NTC temperature sensor 210 in the upper ceramic substrate 300. The connection pin 800 inserted into the through hole 320 formed at the location adjacent to the NTC temperature sensor 210 may be inserted into the through hole 420 formed at a location corresponding to the PCB substrate 400, and may connect a terminal of the NTC temperature sensor 210 and the electrode pattern of the PCB substrate 400.

Furthermore, the connection pin 800 is inserted into the multiple through holes 320 that are formed in a row in the first electrode pattern a and third electrode pattern c of the upper ceramic substrate 300. The connection pin 800 inserted into the multiple through holes 320 formed in the first electrode pattern a and the third electrode pattern c may be inserted into the through hole 420 formed at the location corresponding to the PCB substrate 400, and may connect the semiconductor chip G to the capacitor 410 of the PCB substrate 400.

The connection pin 800 removes various output losses and enables high speed switching by connecting the semiconductor chip G mounted on the upper ceramic substrate 300 to the driving element mounted on the PCB substrate 400 at the shortest distance.

FIG. 11 is a diagram for describing locations of the semiconductor chip and capacitors mounted on the PCB substrate according to an embodiment of the present disclosure.

As illustrated in FIG. 11, the semiconductor chips G are mounted on the lower surface of the upper ceramic substrate 300, spaced apart from each other, and disposed in parallel, and the semiconductor chips G are plural. The capacitor 410 is mounted on the upper surface of the PCB substrate 400 so that the capacitor 410 corresponds to a location between semiconductor chips G1, G2, G3, and G4.

Through holes 320 and 420 are formed in the upper ceramic substrate 300 and the PCB substrate 400, respectively. The through holes 320 and 420 formed in the upper ceramic substrate 300 and the PCB substrate 400, respectively, are for connecting the semiconductor chip G mounted on the upper ceramic substrate 300 to the capacitor 410, the driving element mounted on the PCB substrate 400, etc. at the shortest distance.

The upper ceramic substrate 300 includes the first electrode pattern a, the second electrode pattern b, and the third electrode pattern c. The semiconductor chip G includes the first semiconductor chip G1 and the second semiconductor chip G2 that are disposed to connect the first electrode pattern a and the second electrode pattern b and the third semiconductor chip G3 and the fourth semiconductor chip G4 that are disposed to connect the second electrode pattern b and the third electrode pattern c.

The first semiconductor chip G1 and the second semiconductor chip G2 that are disposed to connect the first electrode pattern a and the second electrode pattern b constitute the high side circuit. The third semiconductor chip G3 and the fourth semiconductor chip G4 that are disposed to connect the second electrode pattern b and the third electrode pattern c constitute the low side circuit.

In the high side circuit, a power source that is introduced into the + terminal of the first terminal 610 is output to the second terminal 620 through the first electrode pattern a of the upper ceramic substrate 300, the first and second semiconductor chips G1 and G2 disposed between the first electrode pattern a and the second electrode pattern b, and the second electrode pattern b. In the low side circuit, a power source that is introduced into the second terminal 620 is output to the − terminal of the first terminal 610 through the second electrode pattern b, the third and fourth semiconductor chips G3 and G4 disposed between the second electrode pattern b and the third electrode pattern c, and the third electrode pattern c.

The drain part of the high side circuit and the source part of the low side circuit shorten a current path by being connected to the PCB substrate 400 on which the capacitor 410 is mounted by the connection pin (reference numeral 800 in FIG. 10). The capacitor 410 is a decoupling capacitor, for example, and is used for the circuit stabilization of the semiconductor chip. Specifically, the capacitors 410 increase the circuit stabilization by making the semiconductor chips G1, G2, G3, and G4 less affected by a noise component and reducing a ripple voltage. Furthermore, a circuit stabilization effect is increased if a current path along which the capacitors 410 are connected to the semiconductor chips G1, G2, G3, and G4 is shortened when being mounted on the PCB substrate 400. An effect of the capacitor is degraded if the current path along which the semiconductor chips G1, G2, G3, and G4 and the capacitors 410 are connected is long.

The drain part of the high side circuit becomes the first circuit pattern a, and the source part of the low side circuit becomes the third circuit pattern c. Furthermore, the first electrode pattern a becomes the drain part of the high side circuit, and the second electrode pattern b becomes the source part of the high side circuit and the drain part of the low side circuit. The third electrode pattern c becomes the source part of the low side circuit.

A power source flows from the drain part to the source part. When the high side circuit is turned on, the low side circuit becomes off. When the low side circuit is turned on, the high side circuit becomes off.

The through holes 320 and 420 include first through holes 320*a* formed in a row in each of the first electrode pattern a and third electrode pattern c of the upper ceramic substrate 300, and multiple second through holes 420*a* formed at locations that communicate with the first through holes 320*a* of the upper ceramic substrate 300 in the PCB substrate 400. The connection pins 800 are perpendicularly inserted into the first through holes 320*a* and the second through holes 420, and perpendicularly connect the first electrode pattern a and the third electrode pattern c on which the semiconductor chip G has been mounted to the electrode patterns on which the capacitors 410 have been mounted. The first through holes 320*a* are formed in a row in each of the first electrode pattern a and the third electrode pattern c.

The through holes 320 and 420 further include a third through hole 320*b* and a fourth through hole 420*b*. The third through hole 320*b* is formed at the center of the gate terminal formed in the upper ceramic substrate 300. The fourth through hole 420*b* is formed in the PCB substrate 400 at a location corresponding to the third through hole 320*b*. The connection pin 800 for connecting the gate terminal and the gate drive IC mounted on the PCB substrate is inserted into the third through hole and the fourth through holes 420*b*.

The gate drive IC includes a high side gate drive IC and a low side gate drive IC that output signals to switch the semiconductor chip.

The through holes 320 and 420 further include a fifth through hole 320*c* and a sixth through hole 420*c*. The fifth through hole 320*c* is formed at the center of the source terminal formed in the upper ceramic substrate 300. The sixth through hole 420*c* is formed in the PCB substrate 400 at a location corresponding to the fifth through hole 320*c*. The connection pin 800 for connecting the source terminal and the gate drive IC mounted on the PCB substrate is inserted into the fifth through hole and the sixth through hole 420*c*.

The through holes 320 and 420 further include a seventh through hole 320*d* and an eighth through hole 420*d*. The seventh through hole 320*d* is connected to a terminal of the NTC temperature sensor (reference numeral 210 in FIG. 7). The eighth through hole 420*d* is formed in the PCB substrate 400 at a location corresponding to the seventh through hole 320*d*, and is connected to an electrode pattern on which the driving element is mounted.

Meanwhile, the gate terminal and the source terminal are included in the source part of the high side circuit and the source part of the low side circuit. For example, the gate terminal and the source terminal are disposed between the first semiconductor chip G1 and the second semiconductor chip G2. The gate terminal and the source terminal are connected to the first semiconductor chip G1 and the second semiconductor chip G2 at the same pattern length.

Furthermore, the gate terminal and the source terminal are disposed between the third semiconductor chip G3 and the fourth semiconductor chip G4. The gate terminal and the source terminal are connected to the third semiconductor chip G3 and the fourth semiconductor chip G4 at the same pattern length.

The gate terminal and source terminal of the high side circuit are connected to the first semiconductor chip G1 and the second semiconductor chip G2 at the same pattern length, and the gate terminal and source terminal of the low side circuit are connected to the third semiconductor chip G3 and the fourth semiconductor chip G4 at the same pattern length, so that high speed switching is advantageous.

The four semiconductor chips are disposed in parallel in a way to be spaced apart from each other, so that two of the four semiconductor chips constitute the high side circuit and the remaining two semiconductor chips thereof constitute the low side circuit. Furthermore, the gate terminal and the source terminal are disposed between two semiconductor chips that constitute the high side circuit and the low side circuit, but the gate terminal and the source terminal are disposed to be connected to the semiconductor chips on both sides thereof at the same pattern length, so that the same line impedance matching is formed and high speed switching is advantageous.

If the gate terminal and the source terminal are connected to the semiconductor chips at the same pattern length in a circuit in which multiple semiconductor chips (switching elements) are connected in parallel, the gate terminal and the source terminal may have the same line impedance and the semiconductor chips may simultaneously become on or off. If the gate terminal and the source terminal are not connected to multiple semiconductor chips at the same pattern length in a circuit in which the multiple semiconductor chips are connected in parallel, a circuit failure is caused because the gate terminal and the source terminal have different line impedance, the on/off times of the semiconductor chips becomes different, and the semiconductor chips do not simultaneously become on/off.

FIG. 12 illustrates a circuit diagram of a power module according to an embodiment of the present disclosure.

As illustrated in FIG. 12, when an ON signal is output to the gate electrode of the high side circuit and an OFF signal is output to the gate electrode of the low side circuit, the high side circuit in which a power source introduced into the first terminal 610 is output to the second terminal 620 through the drain electrode and the source electrode is implemented.

In contrast, when the OFF signal is output to the gate electrode of the high side circuit and the ON signal is output to the gate electrode of the low side circuit, the low side circuit in which a power source introduced into the second terminal 620 is output to the first terminal 610 through the drain electrode and the source electrode is implemented.

In this process, the power source maintains a stable voltage by the capacitor (reference numeral 410 in FIG. 11). Accordingly, the semiconductor chip G can have high efficiency because the semiconductor chip G stably operates even at a high temperature and has a high output characteristic.

Hereinafter, the structure of the power module is more specifically described with reference to FIG. 13.

FIG. 13 is a construction diagram for describing the structure of the power module according to an embodiment of the present disclosure. The construction diagram of FIG. 13 exaggerates and illustrates only major parts of an actual power module so that internal components of the power module illustrated in FIG. 3 can be easily identified. Accordingly, an actual side cross-sectional diagram of FIG. 3 and the construction diagram of FIG. 13 may include a part that is not partially matched with an actual part.

As illustrated in FIG. 13, the power module 10 has a three-layer integration type structure of the lower ceramic substrate 200, the upper ceramic substrate 300, and the PCB substrate 400.

The semiconductor chip G is mounted on the lower surface of the upper ceramic substrate 300, and is disposed between the lower ceramic substrate 200 and the upper ceramic substrate 300. The semiconductor chip G for control for high power is disposed between the lower ceramic substrate 200 and the upper ceramic substrate 300, thus improving heat dissipation efficiency. The PCB substrate 400 for control for low power is disposed at the top, thus preventing damage to the PCB substrate 400 attributable to heat generated from the semiconductor chip G.

The driving element for switching the semiconductor chip G, the capacitor 410 for making a voltage continuous, a connector, etc. are mounted on the upper surface of the PCB substrate 400. The driving element includes the gate drive IC circuit. The gate drive IC circuit includes a high side gate drive IC and the low side gate drive IC.

The electrode patterns are connected to the lower ceramic substrate 200, the upper ceramic substrate 300, and the PCB substrate 400 through the connection pin 800 installed in the through hole formed in at least one of the lower ceramic substrate 200, the upper ceramic substrate 300, and the PCB substrate 400. The through holes are seen from FIGS. 10 and 11. The connection pin 800 installed to penetrate the through hole 320 formed in the upper ceramic substrate 300 and the through hole 420 formed in the PCB substrate 400 in FIG. 11 connects the electrode pattern of the upper ceramic substrate 300 and the electrode pattern of the PCB substrate 400.

The connection pin 800 installed to penetrate the through hole 320 of the upper ceramic substrate 300 and the through hole 420 of the PCB substrate 400 connects the electrode pattern of the upper ceramic substrate 300 and the electrode pattern of the PCB substrate 400 at the shortest distance, and thus facilitates control of great power at high speed by removing various output losses and reducing impedance and inductance.

On the assumption that a voltage is constant, if impedance is low, a current can be easily controlled at high speed because a movement of the current is easy. Furthermore, if inductance is high, it is important to reduce the inductance for high speed switching and heat dissipation because resistance is increased and heat is increased. Impedance and inductance are increased as a connection distance between electrode patterns is increased.

If the lower ceramic substrate 200, the upper ceramic substrate 300, and the PCB substrate 400 are separately manufactured and are assembled and used if necessary, it is difficult to connect the electrode patterns at the shortest distance, and the electrode patterns need to be connected by using a wire, etc. Accordingly, various output losses occur, and there is a limit in which it is difficult to control a current at high speed due to high impedance and inductance.

Accordingly, the power module according to an embodiment minimizes a current path and reduces impedance and inductance by constructing a high output power semiconductor chip module and a drive printed circuit board assembly (PCBA) in an integrated type. The high output power semiconductor chip module is a module having a structure in which a high output semiconductor chip is disposed between the lower ceramic substrate 200 and the upper ceramic substrate 300. The drive PCBA means a PCB assembly that includes a driving element, an electrode pattern, etc. in the PCB substrate 400.

The semiconductor chip G is a GaN chip, and is fixed to the lower surface of the upper ceramic substrate 300 in a flip chip form. If the semiconductor chip G is fixed to the upper ceramic substrate 300 in the flip chip form, the semiconductor chip G may have maximum performance because the distance between the terminals of the semiconductor chip G and the gate drive IC can be designed as short as possible.

The housing 100 that integrate and package the lower ceramic substrate 200, the upper ceramic substrate 300, and the PCB substrate 400 is included. The lower ceramic substrate 200, the upper ceramic substrate 300, and the PCB substrate 400 are disposed at regular intervals within the housing 100.

The heat sink 500 attached to the lower surface of the lower ceramic substrate 200 is included. The heat sink 500 may be bonded to the lower surface of the lower ceramic substrate 200 through soldering. The heat sink 500 is formed to have an area corresponding to the housing 100. An edge of the heat sink 500 may be attached to the lower surface of the housing 100 and fixed thereto by the fixing bolt (reference numeral 150 in FIG. 1).

The bus bars 700 that connect the upper ceramic substrate 300 to the terminals 610 and 620 installed at both ends of the housing 100 are included. The bus bars 700 are connected to the electrode pattern of the upper ceramic substrate 300. The bus bar 700 is formed in a Cu ribbon shape having a predetermined area, and facilitates a movement of a high current by reducing resistance to the maximum.

For example, the lower ceramic substrate 200 may be an active metal brazing (AMB) substrate, the thickness of the ceramic base 201 that forms the AMB substrate may be 0.635 mm, and the thickness of each of the metal layers 202 and 203 over and under the ceramic base 201, respectively, may be 0.8 mm.

For example, the upper ceramic substrate 300 may be an active metal brazing (AMB) substrate, the thickness of the ceramic base 301 that forms the AMB substrate may be 0.38 mm, and the thickness of each of the metal layers 302 and 303 over and under the ceramic base 301, respectively, may be 0.3 mm. Furthermore, the metal layer is a copper foil, for example.

The PCB substrate 400 may be an FR4 substrate having a multi-layer structure, and the thickness thereof may be 0.9 mm, for example. The heat sink 500 may be formed of a copper material, and the thickness thereof may be 4 mm, for example.

The NTC temperature sensor 210 is mounted on the upper surface of the lower ceramic substrate 200. The cutting part 310 having a shape in which a part of the substrate has been cut is formed in the upper ceramic substrate 300 at a location corresponding to the NTC temperature sensor 210. As the semiconductor chip G is fixed to the upper ceramic substrate 300 in the flip chip form, the NTC temperature sensor 210 and the upper ceramic substrate 300 may interfere with each other due to a shortened interval between the upper ceramic substrate 300 and the lower ceramic substrate 200. Accordingly, the interference problem between the NTC temperature sensor 210 and the upper ceramic substrate 300 is solved by forming the cutting part 310 in the upper ceramic substrate 300.

The power module 10 may maintain the interval between the lower ceramic substrate 200 and the upper ceramic substrate 300 by using the spacer (refer to 220 and 230 in FIG. 5). The spacer is bonded to the upper surface of the lower ceramic substrate 200, and it can define the isolation distance between the lower ceramic substrate 200 and the upper ceramic substrate 300 and prevent the bending of the upper ceramic substrate 300. An insulating spacer or a conductive spacer may be selectively applied as the spacer.

The space between the lower ceramic substrate 200 and the upper ceramic substrate 300 and the space between the upper ceramic substrate 300 and the PCB substrate 400 are filled with a silicon fluid S, that is, an insulating material having a semisolid phase, or epoxy. The silicon fluid S or the epoxy is for insulating the lower ceramic substrate 200 and the upper ceramic substrate 300 and insulating the upper ceramic substrate 300 and the PCB substrate 400.

In the power module 10 according to the aforementioned embodiment, the lower ceramic substrate 200 is bonded to the heat sink 500. After the NTC temperature sensor 210 is mounted on the lower ceramic substrate 200, the upper ceramic substrate 300 is fixed over the lower ceramic substrate 200 by using the connection pin 800 and the spacers 220 and 230 in a way to be spaced apart from the lower ceramic substrate 200. Next, the heat sink 500 on which the upper ceramic substrate 300 and the lower ceramic substrate 200 are mounted as an upper and lower duplex structure is coupled to the housing 100. In this case, the end of the fixing bolt 150 is fastened and fixed to the fixing hole of a fixing jig that is disposed under the heat sink 500 by inserting the fixing bolt 150 into the fastening hole 103 of the housing 100 and the communication hole 501 of the heat sink 500. Next, when the PCB substrate 400 is fixed to the housing 100 by coupling the PCB substrate 400 to the locking projection 102 at an edge at the upper surface of the housing 100, the assembly of the power module 10 is completed (refer to FIG. 2).

The aforementioned embodiment may allow great power to be easily controlled at high speed by minimizing a current path and reducing impedance and inductance in a way to manufacture the lower ceramic substrate 200, the upper ceramic substrate 300, and the PCB substrate 400 as a three-layer integration type construction.

FIG. 14 is a diagram for describing a construction in which a detour circuit has been formed by adding a via hole in the PCB substrate as another embodiment of the present disclosure.

As illustrated in FIG. 14, the PCB substrate 400 according to another embodiment has a multi-layer structure. The PCB substrate 400 has an internal electrode pattern P1 formed between a plurality of insulating layers 400a. An upper electrode pattern P2 is formed in the highest layer of the multi-layer structure. For example, the PCB substrate 400 is an FR4 substrate having a multi-layer structure. A gate drive IC K is mounted on the upper electrode pattern P2 as a driving element. The gate drive IC K outputs a signal to switch the semiconductor chip G.

The internal electrode pattern P1 and the upper electrode pattern P2 are metal layers formed of copper, etc.

The through hole 420 is formed in the PCB substrate 400. The through hole 420 is formed to penetrate the PCB substrate 400. The through hole 420 formed in the PCB substrate 400 corresponds to the through hole 320 formed in the upper ceramic substrate 300 disposed under the PCB substrate 400. The through hole 320 formed in the upper ceramic substrate 300 is connected to the gate terminal of the semiconductor chip G that is disposed at the lower surface of the upper ceramic substrate 300. The gate terminal is connected to the electrode pattern on which the semiconductor chip G has been mounted.

The connection pin 800 is disposed in the through hole 420 of the PCB substrate 400 and the through hole 320 of the upper ceramic substrate 300. The connection pin 800 disposed in the through hole 420 of the PCB substrate 400 and the through hole 320 of the upper ceramic substrate 300 perpendicularly connects the upper electrode pattern P2 on the PCB substrate 400 and the gate terminal on the upper ceramic substrate 300.

Accordingly, a switching signal that is output by the gate drive IC K is delivered to the gate terminal through the upper electrode pattern P2 and the connection pin 800, and is delivered from the gate terminal to the semiconductor chip G. The connection pin 800 connects the semiconductor chip G that is mounted on the lower surface of the upper ceramic substrate 300 and the gate drive IC K that is mounted on the PCB substrate 400 at the shortest distance, so that various output losses are removed and high speed switching is made possible.

The PCB substrate 400 includes a detour circuit that connects the upper electrode pattern P2 to the through hole 420 through the internal electrode pattern P1. The detour circuit has multiple circuits formed in parallel to connect the semiconductor chip G and the gate drive IC K, and enables high speed switching by increasing the speed at which a switching signal reaches the semiconductor chip G by reducing impedance (resistance). Since an object of the power module using the GaN chip as the semiconductor chip G is high speed switching, it is important to increase the speed at which the switching signal reaches the semiconductor chip G by reducing impedance.

Sufficiently low impedance may not be obtained although the output terminal of the gate drive IC K and the gate terminal of the semiconductor chip G are connected at the shortest distance in order to reduce impedance between the terminals. In this case, in order to reduce the impedance, the area of the electrode pattern may be widely designed. However, if the size of the PCB substrate 400 is small, there is a limit to a circuit design in widening the area of the electrode pattern.

Accordingly, the detour circuit for widening the area of the electrode pattern 400b is formed in the PCB substrate 400. The detour circuit includes a conductive layer P3, the internal electrode pattern P1, and a connection layer P4.

The conductive layer P3 is formed on the internal wall surface of the through hole 420. The internal electrode pattern P1 is connected to the conductive layer P3. The internal electrode pattern P1 is multiple, and the multiple internal electrode patterns P1 are connected to the conductive layer P3 in parallel. A via hole h that connects the internal electrode pattern P1 and the upper electrode pattern P2 is formed in the connection layer P4. The via hole h is filled with a conductive substance. The connection layer P4 connects the internal electrode pattern P1 and the upper electrode pattern P2. The via hole h is formed at a location spaced apart from the through hole 420. Preferably, the via hole h is formed to connect the internal electrode pattern P1 and the upper electrode pattern P2 at a location between the through hole 420 and the gate drive IC K.

The connection layer P4 and the conductive layer P3 that connect the multiple internal electrode patterns P1 in parallel connect the internal electrode patterns P1 and the upper electrode pattern P2, and they shorten the length of the electrode pattern to the maximum and also widen the area of the electrode pattern. Accordingly, impedance can be reduced, and the speed at which a switching signal reaches the semiconductor chip G can be increased.

The lowest layer of the PCB substrate 400 is the insulating layer 400a.

In an embodiment, a metal layer is formed in the lowest layer of the PCB substrate 400. In another embodiment, however, a metal layer is not formed and the insulating layer 400a is exposed, at the lowest layer of the PCB substrate 400.

In the power module, in order to reduce the length that connects the output terminal of the gate drive IC K and the gate terminal of the semiconductor chip G, an interval between the PCB substrate 400 and the upper ceramic substrate 300 needs to be designed to be small to the maximum. However, if the interval between the PCB substrate 400 and the upper ceramic substrate 300 is small, an insulating breakage problem may occur. Accordingly, insulating performance may be implemented by exposing the insulating layer 400a at the lowest layer of the PCB substrate 400 without using a metal layer at the lowest layer of the PCB substrate 400. Insulation between the PCB substrate 400 and the upper ceramic substrate 300 can be further secured by the thickness of the insulating layer 400a at the lowest layer of the PCB substrate 400.

In another embodiment, the insulating layer 400a has a three-layer structure, and the internal electrode pattern P1 has a two-layer structure.

In the present disclosure, the upper electrode pattern P2 and the internal electrode pattern P1 are connected by forming, in the PCB substrate 400, the via hole h that connects the upper electrode pattern P2 and the internal electrode pattern P1. The internal electrode pattern P1 is connected to the connection pin 800 disposed in the through hole 420 by forming the conductive layer P3 on the inner wall of the through hole 420. In this case, by forming the detour circuit that connects the upper electrode pattern P2 to the connection pin 800 of the through hole 420 through the internal electrode pattern P1, impedance is reduced because the area of the electrode pattern is widened while the length of the electrode pattern is reduced to the maximum. Accordingly, high speed switching is made possible because the speed at which a switching signal reaches the semiconductor chip G is increased.

Furthermore, the present disclosure can minimize the distance between the PCB substrate 400 and the upper ceramic substrate 300 disposed under the PCB substrate 400 by forming the PCB substrate 400 as a multi-layer structure, but the lowest layer as the insulating layer 400a. In this case, insulating performance is implemented, and the output terminal of the gate drive IC and the gate terminal of the semiconductor chip G are connected at the shortest distance. Accordingly, an output loss is reduced, and high speed switching is made possible.

Optimum embodiments of the present disclosure have been disclosed in the drawings and specification. Specific terms have been used in the present specification, but the terms are used to only describe the present disclosure, not to limit the meaning of the terms or the scope of right of the present disclosure written in the claims. Accordingly, a person having ordinary knowledge in the art will understand that various modifications and other equivalent embodiments are possible from the embodiments. Accordingly, the true technical range of right of the present disclosure should be determined by the claims below.

The invention claimed is:

1. A power module comprising:
 a PCB substrate having a multi-layer structure in which an internal electrode pattern is formed between a plurality of insulating layers and an upper electrode pattern is formed in a highest layer of the multi-layer structure;
 a through hole configured to penetrate the PCB substrate;
 a connection pin disposed in the through hole and connected to the upper electrode pattern; and
 a detour circuit configured to connect the upper electrode pattern to the through hole through the internal electrode pattern.

2. The power module of claim 1, wherein the detour circuit comprises:
 a conductive layer formed on an internal wall surface of the through hole;

the internal electrode pattern connected to the conductive layer; and a connection layer filled into a via hole formed to connect the internal electrode pattern and the upper electrode pattern and configured to connect the internal electrode pattern and the upper electrode pattern.

3. The power module of claim 2, wherein the internal electrode pattern comprises multiple internal electrode patterns, and the multiple internal electrode patterns are connected to the conductive layer in parallel.

4. The power module of claim 2, wherein the via hole is formed at a location spaced apart from the through hole.

5. The power module of claim 1, wherein the PCB substrate is an FR4 substrate.

* * * * *